United States Patent [19]

Vlasak

[11] Patent Number: 4,525,224

[45] Date of Patent: Jun. 25, 1985

[54] METHOD FOR THE DOPING OF SUPPORTING SILICON PLATES FOR THE MANUFACTURE OF SEMICONDUCTORS

[75] Inventor: Thomas Vlasak, Birr, Switzerland

[73] Assignee: BBC Brown, Boveri & Cie, Baden, Switzerland

[21] Appl. No.: 611,930

[22] Filed: May 22, 1984

Related U.S. Application Data

[63] Continuation of Ser. No. 353,810, Mar. 2, 1982, abandoned.

[30] Foreign Application Priority Data

Mar. 2, 1981 [CH] Switzerland ............... 1372/81

[51] Int. Cl.³ .................................. H01L 21/223
[52] U.S. Cl. .................................. 148/189; 118/500
[58] Field of Search ................ 148/189; 118/500

[56] References Cited

U.S. PATENT DOCUMENTS

| | | | |
|---|---|---|---|
| 3,143,444 | 8/1964 | Lowe et al. ............... | 148/189 X |
| 3,314,833 | 4/1967 | Arndt et al. ............... | 148/189 |
| 3,604,694 | 9/1971 | Muller ...................... | 148/189 X |
| 3,644,154 | 2/1972 | Hoogendoorn et al. ...... | 148/187 |
| 3,972,838 | 8/1976 | Yamashita et al. .......... | 148/189 X |
| 3,997,379 | 12/1976 | Rosnowski .................. | 148/189 |
| 4,193,826 | 3/1980 | Mochizuki et al. .......... | 148/189 |
| 4,235,650 | 11/1980 | Chang et al. ............... | 148/189 |

Primary Examiner—George T. Ozaki
Attorney, Agent, or Firm—Oblon, Fisher, Spivak, McClelland & Maier

[57] ABSTRACT

A method for the locally selective doping of a planar substrate, essentially made of silicon, for the production of semiconductors using a diffusion process, in which aluminum as the doping additive is applied by vaporizing in a vacuum at temperatures above 500° C. to the substrate surface areas to be doped and permitted to diffuse into the substrate. A part of the substrate surface is masked in order to prevent the doping of the substrate beneath the mask, by forming a $SiO_2$ layer on the substrate and abutting a masking plate against the $SiO_2$ layer.

8 Claims, 5 Drawing Figures

METHOD FOR THE DOPING OF SUPPORTING SILICON PLATES FOR THE MANUFACTURE OF SEMICONDUCTORS

This application is a continuation of application Ser. No. 353,810, filed Mar. 2, 1984, abandoned.

BACKGROUND OF THE INVENTION

1. Field of the Invention

This invention relates to a method and apparatus for doping impurities into a semiconductor substrate.

It is a common practice in semiconductor manufacture, for instance for the purpose of manufacturing integrated circuits, power-semiconductor components and the like, to perform the doping of a flat substrate which is made essentially of silicon, hereinafter referred to as "Si-substrate"—at least in part by a method which is generally known as diffusion or impurity diffusion.

Depending on the type and the intended use of the semiconductor to be manufactured, the diffusion method can be applied with different doping additives, different methods of localization or, respectively, the control of the doping, and also by means of different process sequences.

Examples for known doping additives are arsenic, antimony and phosphorus (donor or, respectively n-doping), or boron, gallium and aluminum (acceptor, respectively p-doping), which may be evaporated in their elemental or necessarily chemically bonded form, such as, for instance in their oxidized form, and be applied to the supporting carrier substrate.

Typical examples of steps for known methods for the localization of the doping are, on the one hand, covering, or masking of the Si-substrate in the areas not to be doped and, on the other hand, the subsequent locally selective removal of the previously flatly doped areas and, if needed, with a subsequent thermal treatment (drive-in-stage), for the purpose of diffusing the doping additive deeper into the Si-substrate in the remaining doped areas, and after the selective removal process.

Of these steps for local selective doping, the covering, i.e. masking, is as a rule the simpler step when compared with the subsequent removal process.

In addition, for the purpose of a local removal of the Si/doping additive-phase generated by the diffusion, the underlying layer, i.e. the layer which has been exposed by the subsequent removal of the Si/doping additive phase, must have predetermined properties which cannot always be obtained or which can be obtained with great difficulty only. Finally, the usually occurring groove structure caused during the subsequent removal of the Si/doping additive phase may be detrimental to an otherwise practically planar surface of the Si-substrate.

For the masking of a predetermined cohesive surface, or the masking of predetermined partial areas of a surface, which is advantageous for several reasons, of areas of the Si-substrate not to be doped, a masking layer for preventing or effectively delaying the access of the doping means to the part of the substrate lying underneath the masking layer, and considering the methods of the process, is a prerequisite. Inasmuch as the doping by diffusion takes place in the presence of high temperatures of typically above 500° C., the prior masking layers which contain organic components, such as, for instance, the conventional photo-lacquer masks, in this case are unsuited in principle because of their thermal decompoundability.

One known and thermally stable masking layer for diffusion processes is made of silicon oxide, for instance in the form of a coating created by epitaxy and the vapor application of silicon in the presence of trace amounts of oxygen on a substrate of silicon, or else in the form of a fused-on, glass-like coating on the basis of silicon dioxide.

It is, however, a known fact (see, for instance B. R. M. Burger and P. P. Donovan, "Fundamentals of Silicon Integrated Device Technology", Prentice-Hall, U.S.A., 1967, Volume I, pages 153–155), that of all of the conventional p-doping additives only boron has a sufficiently low diffusion coefficient in silicon dioxide, to permit the use of an adhesive masking layer of silicon dioxide for the effective masking of the Si-substrate.

Gallium, on the other hand, diffuses through silicon dioxide about 400 times faster than through silicon, given typical diffusion temperatures in the range of 800°–1300° C.; similar values must be used in connection with aluminum, and it may be assumed that, given the temperature conditions for this process, that aluminum diffuses at least about 100 times faster through silicon dioxide than through silicon.

Whenever a Si-substrate with an adhesive mask coating of silicon dioxide is doped with gallium or aluminum in a diffusion process, this is done, as noted in the publication cited above, on the assumption that the diffusion effect of these doping additives underneath the silicon dioxide coating of the Si-substrate is identical to the diffusion effect obtained without the presence of an adhesive silicon dioxide coating.

This means that a masking layer of an adhering silicon dioxide on the Si-substrate during the diffusion for doping with aluminum or gallium might be useful for other, previous or subsequent, processes or semiconductor functions, respectively, or that it remain useful, but that in no manner is it suitable as an effective masking layer for the localized selective doping with aluminum or gallium.

Silicon nitride, in contrast to silicon dioxide, is impenetrable to doping additives such as aluminum to such an extent that it would be suitable as a masking coating for the localized selective doping of Si-substrates. The investment in needed processes and apparatus, however, to produce silicon nitride layers on silicon substrates is so high and the reproducibility is so uncertain that this particular method is hardly suitable, at least not for purposes of commercial production.

Given the present state of the art, masking coatings of silicon dioxide can be used in commercial semiconductor production only if the doping is performed with boron, but not with aluminum or gallium, since so far there are no maskings and coverings of record which are sufficiently impenetrable to aluminum or gallium and which can be applied at reasonable expense.

Aluminum as such is preferable as a doping additive for Si-substrates because it diffuses relatively quickly into silicon and since it is relatively easy to handle. For purposes of locally selective p-doping using the diffusion method, aluminum so far could be used only with the comparatively unfavorable method of subsequent removal of the aluminum-silicon phase created during the vapor application or diffusion, respectively, or by using the technically demanding silicon nitride coating for a masking of the Si-substrate.

SUMMARY OF THE INVENTION

Accordingly, one object of the invention is to provide a novel method for the locally selective doping of Si-substrates with aluminum in a diffusion process, utilizing a masking, while nevertheless preventing a diffusion of the aluminum into the Si-substrate area lying directly beneath the masking, i.e. during the duration of the treatment and given the conditions of the process, delaying it at least to the same extent as the Si-substrate.

This and other objects are achieved according to the invention by providing as a masking a silicon dioxide coating together with a masking plate lying against the silicon dioxide layer. The definition of "lying against" in this case is to be understood as being the mechanical and detachable contact between two surfaces which normally is caused by an exterior force or pressure, such as gravity, and which, by means of a corresponding counter-force, e.g. a lifting force, or a discontinuation of the application of the exterior force, i.e. the termination of pressure, can be loosened.

The invention is based of the following experimental results:

(a) Whenever, in a diffusion chamber and under doping conditions, planar, smooth test discs, made of silicon and either having silicon dioxide coatings or not, and being arranged at a distance from each other, are treated with aluminum, a practically identical doping with aluminum was discovered at the free silicon surfaces as under the silicon dioxide covered surfaces, which corresponds to the teachings of the state of the art and proves the ineffectiveness of a silicon dioxide layer for the masking of the Si-substrate lying beneath the silicon dioxide coating;

(b) whenever two test plates of silicon, not having silicon dioxide coatings, and arranged lying closely against each other are treated in the same manner, all silicon surfaces, and thus also the surfaces of a pair of discs which are lying against each other in the border areas, are doped with aluminum;

(c) if, however, one of the two surfaces of a pair of discs, lying closely against each other in the bordering areas, is previously given a coating of silicon dioxide, no aluminum doping is detected underneath the silicon dioxide layer of the disc which has been coated with silicon dioxide, while all free surfaces and also those mechanically lying against the silicon dioxide coating, but not having been given an adhesive silicon dioxide coating, have been doped with aluminum;

(d) if a part of the silicon dioxide layer on one of the discs is not covered by the other disc, aluminum doping will again be detected on the Si-substrate underneath of this uncovered part of the adhesive silicon dioxide layer;

(e) if both of the pair of discs each have been given an adhesive silicon dioxide coating at their mechanically adjoining surfaces, i.e. at the contact border line, neither of the two discs will show aluminum doping underneath the respective silicon dioxide coating.

This means that a mechanical abutment of discs during doping with aluminum provides an effective shield only if at least one of the surfaces has an adhesive silicon dioxide coating in the masked area.

The causes for these surprising partial findings (c) and (e) have not yet been found; however, in view of the partial findings (b) and (d), it must be excluded that a purely mechanical, physical masking is sufficient for the prevention of doping with aluminum, just as a non-masked adhesive silicon dioxide coating is ineffective for this purpose. It is possible that a physically coated $SiO_2$-layer in this case has the effect of a getter.

It had not been expected that the combination of a silicon dioxide layer, which as such is ineffective for a masking against aluminum diffusion, with a mechanical masking which, again, as such is also ineffective for this purpose, can effectively prevent the aluminum diffusion through the adhesive silicon dioxide coating into the area of the Si-substrate underneath it, inasmuch as the use of silicon dioxide coatings as covers or masks in the doping of Si-substrates with aluminum by diffusion has, in the past, been described as being unsuitable, and inasmuch as the conventional use of mechanical masking, known from, for instance the techniques of applying by vaporization thin film materials (see, for instance, L. I. Maissel et al., "Handbook of Thin Film Technology", MacGraw Hill, 1970, pages 7-2 to 7-4) and also witnessed by the experiments under (b) has been shown as being ineffective when used alone, as has also been shown by the test, to prevent aluminum diffusion into the masked area of the Si-substrate.

The teachings of the invention, whereby a silicon dioxide layer covered by a mechanical covering or mask, respectively, adhering to the surface area of the substrate or the carrier to be masked, is suitable as a means to prevent aluminum diffusion into the area of the substrate lying underneath the masked silicon dioxide layer, offers an important simplification of the p-doping of Si-substrates for semiconductor production. A more detailed description follows below.

The supporting plate, i.e. the Si-substrate, consists essentially, i.e. as a rule, of more than 50% and, preferably more than 90% by weight and, as an example, at least 99% by weight of silicon in its pure form, customary in semiconductor production, being sufficiently pure and having a suitable crystalline structure. The carrier is "planar", which means that it has at least one practically plane surface which can be covered or masked during the diffusion process. Conventional shapes of planar carriers of silicon are polygonal, e.g. rectangular, or round, e.g. circular plates with two practically parallel main surfaces. Typical examples of suitable Si-substrates are circular discs of silicon in thicknesses of 100 $\mu$m to 3 mm and weights from 0.2 g to 50 g.

Those and similar Si-substrates with an adhesive $SiO_2$-layer on one or both of their surfaces, generated by epitaxy, having $SiO_2$ layer thicknesses of, e.g., 50 nm to 10 $\mu$m, are technically available or may be manufactured with conventional processes and can be used for the method proposed by the invention.

Plates or plate-shaped Si-substrates with an $SiO_2$ coating, generated by epitaxy and having a thickness of $\geq 50$ nm on one of their sides (main surface) are preferred for many purposes of the invention.

The diffusion process usually is carried out in conventional diffusion ovens, i.e. in vacuum chambers which are dimensioned so as to accept a certain number or a charge of carrier plates which are arranged at a distance from each other and which make the heating of these carriers plates to temperature of, typically, 800° to 1300° C. possible.

In a basically known manner, aluminum, preferably in pure elemental form is used as p-doping additive and is vaporized in a known manner during the diffusion process. The operation usually takes place in a hard vacuum of, for instance $10^{-3}$ torr or more, for instance at $10^{-5}$ torr or more. If so desired, the air present in the diffusion oven may be replaced by nitrogen or inert gas prior to evacuation.

The method according to the invention can be applied at temperatures commonly used for diffusion processes, in a range of 1000° to 1250° C., and during a pre-determined time span. The duration of the treatment depends on the desired diffusion depth of the doping additive and, typically, is within a range of between 1 minute and 10 hours, for instance, in a range of between 10 and 200 minutes. Typically, a time span of about 100 minutes suffices for an aluminum diffusion depth of 2 $\mu$m in the Si-substrate at about 1000° C.

For use as covering or masking plates, planar objects, i.e. having at least one plane surface, are preferred, made of materials which are practically inert not only under process conditions, but which do not contain undesirable pollutants for the Si-substrate, i.e. not any accidentally present doping additive. Preferred covering or masking plates have, just as the Si-substrates, two practically parallel main surfaces.

The thickness of the covering- or masking plate depends generally on the diffusion velocity of aluminum in the material of the covering or masking plate, in the sense that the timespan required for the diffusion of the doping additive through the cover or masking plate under process conditions should, preferably, be at least as long as the timespan needed for the complete diffusion of aluminum through the Si-substrate. Covering or masking plates made of elemental silicon are preferred for many purposes; in this instance, the thickness of the covering or masking plate, preferably will be about identical to the thickness of the Si-substrate.

Whenever other materials, such, as for instance, ceramic materials are used for the covering or masking plates, it is practical to select correspondingly thicker plates, if the diffusion velocity of aluminum, under process conditions, is greater in these substances than it is in silicon. Thus, for instance, a covering or masking plate of silicon dioxide, e.g. of quartz or quartz glass can be used in accordance with the invention, when this plate is at least 500 times, and, e.g. 1000 times thicker than the intended diffusion depth in the Si-substrate.

It must be emphasized that the covering or masking plate in the method of the invention is mechanically, i.e. detachably lying against the silicon dioxide layer, which, in turn is adhering fixedly and not easily detachable on the covered, or, respectively, masked substrate, e.g. as a silicon dioxide layer applied by epitaxy of by fusing. In practical use it is preferable that the covering- or masking plate abuts with a certain surface pressure, e.g. of at least 1 Pa and, preferably, 5 Pa or more against the silicon dioxide layer.

Preferably, the covering or masking plate abuts as closely as possible to the surface area of the Si-substrate to be shielded from aluminum-diffusion. This means, quantitatively, that the silicon dioxide layer adhering to the substrate as well as the mechanically abutting surface of the covering- or masking plate each, preferably, have planar - values, defined according to ISO-Norm 1302, of better than ⌒5 $\mu$m and roughness - values, again defined according to ISO-Norm 1302, of better than Ra=0.4 $\mu$m.

In practical use, it usually is possible to obtain sufficient abutting pressure by the Si-substrate in the form of polygonal or round plates or discs, respectively with their adhering silicon dioxide layer lying againt the planar covering- or masking plates under pressure of their own weight.

According to a particularly preferred embodiment which is especially suitable for the production of high-powered semiconductors, of the method of the invention, two each of the plate- or disc-shaped SI-substrates of equal thickness and size, having one-sided coatings of silicon-dioxide generated by epitaxy, are jointed to form sandwiched pairs, in which the silicon-dioxide layers lie against each other and whereby one of the substrates of each pair serves as a cover plate for the other substrate. After the method of the invention has been applied, the $SiO_2$-coating adhering to the Si-substrates may be partially or completely removed, for instance by means of conventional etching methods; for many uses or, production purposes, however, the $SiO_2$-coating may remain at the Si-substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
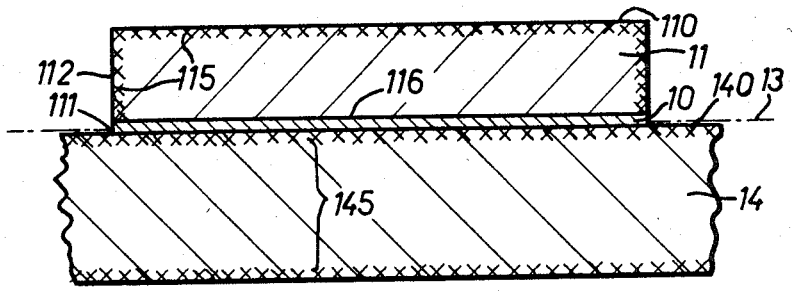
FIG. 1 is a cross-sectional view of a Si-substrate on a covering plate.

Referring now to the drawings, wherein like reference numerals designate identical or corresponding parts throughout the several views, and more particularly to FIG. 1 thereof.

There is shown in a sketched, enlarged cross section a disc-shaped carrier 11 of silicon, with two planar, parallel main surfaces 110, 111. The one main surface 111 is formed by an adhesive smooth layer 10 of $SiO_2$, generated by epitaxy (and here exaggerated by a thick line), having a thickness of 0.2 to 2 $\mu$m, resting on the plane, smooth surface 140 of a cover plate 14, of e.g. elemental silicon. For practical purposes, the border surface 13, indicated by a dash-dotted line between the main surface 111 of the carrier or substrate 11 and the surface 140 of the covering plate, is of a thickness too small to be measured.

When doping with aluminum in a diffusion oven at about $10^{-5}$ torr and about 1000° C., the cross-hatched areas 115 of the upper, i.e. free surface 11 of the substrate 11 and its equally free rim surface 112 is doped with aluminum, whereby the diffusion depth depends on the duration of the treatment or, respectively, the possible changes in the treatment temperature.

The cross-hatched areas 145 on both sides of the covering plate 14 are also doped with aluminum during this process.

While the upper surface of the covering plate 14 is doped with aluminum in the area covered by the substrate 11 in its border layer 13, there will be no doping with aluminum in the area 116, behind the $SiO_2$-layer 10 of the substrate 11.

The "lateral diffusion" of the aluminum into the border surface in the outer rim area of the $SiO_2$-layer 10 usually equals the "vertical diffusion" as it occurs vertically to the exposed surfaces 110, 112 of the substrate and through these surfaces into the substrate, but, with correspondingly inferior surface qualities, it can be two-to five times greater without affecting the usefulness of the products obtained. Depending on the intended use of the final products, a lateral diffusion amounting to ten times the vertical diffusion or more, can still be acceptable, if the relation between the effectively masked or covered area to the area doped by lateral diffusion is considerable and/or lateral diffusion determined by simple tests and relating to the given surface qualities of the border surfaces is taken into consideration when dimensioning the areas which are not to be doped.

After diffusion treatment, the substrate 11 is lifted from the cover plate 14 and is ready for processing with conventional methods.

If the cover plate 14 is to be utilized once again for the process as proposed by the invention, its contact surfaces are cleaned of aluminum which has diffused into them, by, preferably, conventional etching methods.

FIG. 2 shows, again in a sketched and enlarged cross section, a substrate 21 of having a circular main surface 221 provided with a $SiO_2$layer 20 generated by epitaxy and resting on a covering- or masking plate 24. This plate 24 is a punched disc of silicon and, practically has the same thickness and the identical outer diameter as the substrate 21.

Again, during the doping with aluminum by diffusion under conditions as described above, the free surfaces of the substrate 21 in the areas indicated by cross-hatching 215 (upper main surface 210 and rim surface 212) will be doped by aluminum, as well as all surfaces 245 of the masking plate 24. In the area of the cut-out 23, serving as a window in the mask, a portion 203 of the $SiO_2$-layer of the substrate 21 is not covered and therefore permits the aluminum to diffuse through it, so that the substrate will show a partial area 213 which is behind the adhesive, but not covered $SiO_2$-layer, and which has been doped with aluminum, located in the center of the otherwise not doped area 216.

Regarding the lateral diffusion, the continued processing of the substrate 21 and the repeated use of the masking plate 24, the remarks made in connection with FIG. 1 apply.

Figure 3:
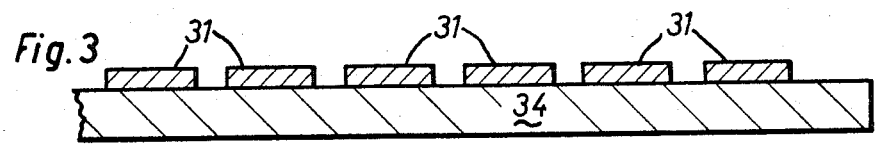
FIG. 3 is a cross-sectional view of a multitude of Si-substrates with a common covering plate.

FIG. 3 is a sketched sectional view of a plurality of substrate 31, resting on a common, plane, smooth masking plate 34 with the $SiO_2$-layers (not shown) of their respective bottom main surfaces. The plate 34 is made of e.g. silicon. This corresponds to an embodiment suitable for commercial production of the method of the invention, whenever the covering plate 34, or several such plates with superimposed Si-substrates 31 are to be subjected, in a diffusion oven, to locally selective diffusion treatment with aluminum, locally selective indicating a treatment whereby the covered main surface of the substrate 31 remains practically dopant-free, using the above described conditions of treatment.

Figure 2:
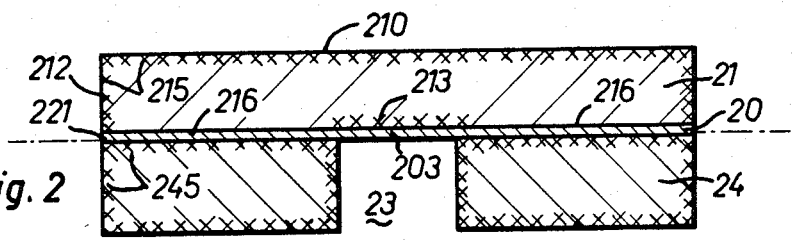
FIG. 2 is a cross-sectional view of a Si-substrate lying against a masking plate.

Regarding the embodiments shown in FIG. 1 to 3, it must be noted that the substrates 11, 21 and 31 each are lying against the masking plates 14, 24 and 34, respectively, with the pressure of their own weight of about, typically, 5 Pa.

Figure 4:
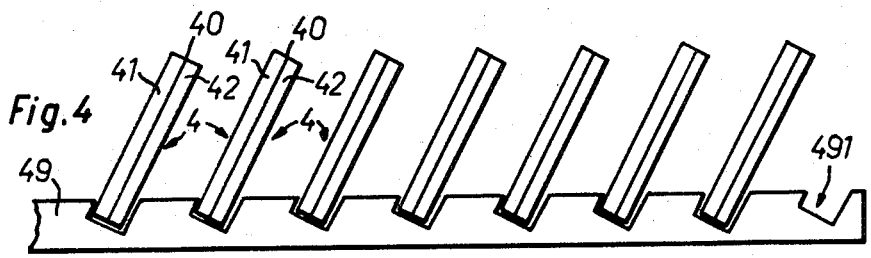
FIG. 4 is a side view of a multitude of sandwiched combinations of Si-substrate pairs in an apparatus for the simple holding of the pairs along the rims of these pairs.
Figure 5:
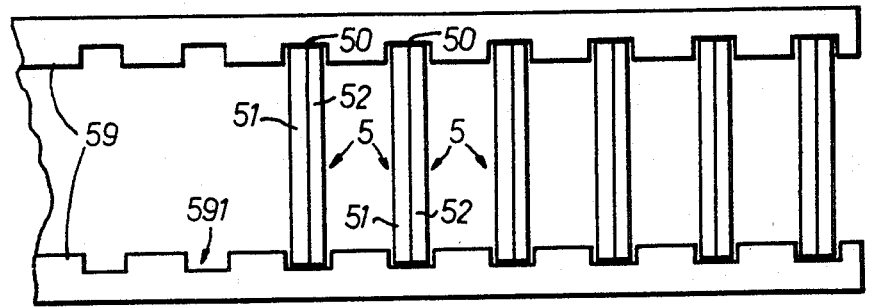
FIG. 5 is a top view of a device for the multiple holding along rims of inserted pairs of sandwiched combinations of Si-substrates.

The carrier pair-arrangement as shown in FIGS. 4 and 5 in a sketched side view and top view, respectively, illustrate a particularly preferred embodiment of the method of the invention. It is their common characteristic that two each of identical Si-substrates or carriers 41, 42, respectively 51, 52, are combined as pairs of carriers 4, 5, whereby the carriers 41, 42 and 51, 52 each are, at their main surfaces, being provided with a $SiO_2$-layer, generated by epitaxy, inserted, as sandwiches, with the $SiO_2$-layers adjoining (40, 50)—into corresponding recesses 491, 591, of the frame elements 49, 59.

The pairs of carriers 4 of FIG. 4 are pressed against each other by the particularly effective weight of the respective upper plate of each pair (on the left side in FIG. 4). The frame element as shown in FIG. 5 can be arranged, as desired, either "standing", i.e. with the plate pairs 5 positioned approximately horizontally, or "recumbent" i.e. with approximately vertically positioned plate pairs 5, or else in an intermediate position, when they are placed into the diffusion oven.

Whenever pairs of substrates include an angle of zero to about 80° with the horizontal, the individual weights of each respective upper plate may be sufficient for providing the abutting pressure. In the case of approximately vertically (90°±10°) arranged plate pairs, the recesses in the frame element 59 preferably will be so designed that the two plates of each pair will be pressed against each other. This can be achieved very simply, for instance by designing the cross section of the recesses 591 in a suitable trapezoid, conical (not shown) shape or by the use of inserted wedges and other devices insuring a holding by pressure.

The frame elements 49, 59, respectively, may be designed as one piece or in several parts and usually are made of materials which are inert during processing conditions and are free of undesirable foreign elements. As an example for a preferred element for the racks or frame elements 49, 59, silicon must be mentioned.

The paired arrangement described in FIGS. 4 and 5 permits a comparatively very high packing capacity in the diffusion oven. Inasmuch as no special covering plates are used, since one plate of a pair serves as the masking for the other plate, there is no need to clean masking plates. Also a quantitative removal of diffused aluminum from the frame elements 49, 59 between diffusion treatments is comparatively less critical since the frame elements touch the carriers only at their rims.

Since Si-substrates which are selectively coated with $SiO_2$ either on one side or in any other way, are commercially available, a locally selective doping with aluminum which avoids the coated surfaces can be done in mass production, with a comparative minimum of additional investments, when compared with the heretofore necessary subsequent removal of surfaces or parts of surfaces of Si-substrates doped with aluminum. The manufacture of Si-substrates which are doped with aluminum on one of their main surfaces only is particularly important for the mass-production of high-powered semiconductors. As has been described above, in connection with FIG. 2, partial areas of surfaces also may be covered or masked, respectively, whereby suitable masks will permit the realization of fine structures in the size range of about 1 mm which, in practical use, will be influenced by the obtainable surface quality (planarity, roughness) in the border surface area.

Obviously, numerous additional modifications and variations of the present invention are possible in light of the above teachings, It is therefore to be understood that within the scope of the appended claims, the invention may be practiced otherwise as specifically described herein.

What is claimed as new and desired to be secured by Letters Patent of the United States is:

1. A method for selectively diffusing aluminum into at least a first silicon substrate having a first surface, comprising the steps of:
    defining on said first surface a first surface portion to be masked and a first unmasked surface portion;
    covering at least said first surface portion to be masked with a first layer of silicon dioxide grown onto said first surface portion to be masked;
    additionally covering only said first portion to be masked with a masking plate abutting against said first silicon dioxide layer, whereby said first surface portion to be masked is masked by said silicon dioxide layer and said masking plate;
    subjecting said first silicon substrate with said first silicon dioxide layer and said masking plate to a source of aluminum impurities under vacuum conditions and at temperatures between 800° C. and 1300° C.; and
    diffusing said aluminum impurities into said first silicon substrate at said first unmasked surface portion.

2. The method of claim 1, wherein said vacuum conditions are better than $10^{-3}$ Torr and said temperatures lie between 1000° C. and 1250° C.

3. The method according to claim 2, wherein said covering step comprises covering said first surface portion to be masked with said first layer of silicon dioxide which is 0.2 to 2.0 μm thick.

4. The method of claim 1, wherein said masking plate is a silicon plate with a thickness identical to the thickness of said first silicon substrate.

5. The method of claim 4, wherein said silicon plate is a second silicon substrate identical to said first silicon substrate, said second silicon substrate having a second surface corresponding to said first surface of said first silicon substrate, comprising the further steps of:
    defining on said second surface a second portion to be masked and a second unmasked portion;
    covering at least said second surface portion to be masked with a second layer of silicon dioxide grown onto said second surface; and
    putting said first and second silicon substrate together with said first and second masked surface portions abutting against one another, whereby said second silicon substrate acts as a masking plate and masks said first surface portion to be masked and said first silicon substrate acts as a masking plate and masks said second surface portion to be masked.

6. The method according to claim 5 wherein said covering step comprises covering said first surface porton to be masked with said first layer of silicon dioxide which is 0.2 to 2.0 μm thick.

7. The method according to claim 4, wherein said covering step comprises covering said first surface portion to be masked with said first layer of silicon dioxide which is 0.2 to 2.0 μm thick.

8. The method according to claim 1, wherein said covering step comprises covering said first surface portion to be masked with said first layer of silicon dioxide which is 0.2 to 2.0 μm thick.

* * * * *